US012756154B2

(12) United States Patent
Patra et al.

(10) Patent No.: US 12,756,154 B2
(45) Date of Patent: Oct. 6, 2026

(54) SYSTEMS AND METHODS FOR COOLING HIGH POWER DEVICES

(71) Applicant: Lawrence Livermore National Security, LLC, Livermore, CA (US)

(72) Inventors: Susant K. Patra, Brentwood, CA (US); Robert J. Deri, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 805 days.

(21) Appl. No.: 18/155,503

(22) Filed: Jan. 17, 2023

(65) Prior Publication Data

US 2024/0243545 A1 Jul. 18, 2024

(51) Int. Cl.

*H01S 5/024* (2006.01)
*H10N 10/80* (2023.01)
*H10W 40/28* (2026.01)
*H10W 40/73* (2026.01)

(52) U.S. Cl.

CPC ......... *H01S 5/02415* (2013.01); *H10N 10/80* (2023.02); *H10W 40/28* (2026.01); *H10W 40/73* (2026.01)

(58) Field of Classification Search

None

See application file for complete search history.

(56) References Cited

U.S. PATENT DOCUMENTS 4,791,634 A * 12/1988 Miyake ............... F28D 15/0266 372/69
4,901,324 A * 2/1990 Martin .................... H01S 3/042 372/36

(Continued)

FOREIGN PATENT DOCUMENTS

EP 2023452 A2 * 2/2009 ........... H01S 5/4025
EP 4123702 A1 * 1/2023 ......... H05K 7/20336

(Continued)

OTHER PUBLICATIONS

International Searching Authority, International Search Report and Written Opinion, PCT International Application No. PCT/US2024/011605, mailed May 3, 2024.

(Continued)

*Primary Examiner* — Jenna M Maroney
(74) *Attorney, Agent, or Firm* — HARNESS, DICKEY & PIERCE, P.L.C.

(57) ABSTRACT

A thermoelectric cooling (TEC) embedded electronics system having a substrate with a first surface and a second surface, and constructed of a thermally and electrically conductive material, and a die. The die is configured to be supported from the first surface of the substrate and in thermal contact with the substrate. The die forms a heat generating component. A TEC material element is used which has a first surface and a second surface and is configured to be positioned at least partially against the second surface of the substrate. A heat pipe is provided which has a first portion and a second portion. The first portion is configured to be in thermal contact with the second surface of the TEC material, and the second portion is configured to sink heat generated by the die and transmitted through the substrate and the TEC material element.

18 Claims, 7 Drawing Sheets

(56) References Cited

U.S. PATENT DOCUMENTS

| | | | | |
|---|---|---|---|---|
| 5,309,457 | A * | 5/1994 | Minch | H01S 5/4025 165/104.33 |
| 6,614,109 | B2 | 9/2003 | Cordes et al. | |
| 7,170,000 | B2 * | 1/2007 | Maeda | G06F 1/203 136/218 |
| 7,224,059 | B2 * | 5/2007 | Shimada | H01L 23/38 257/714 |
| 7,360,903 | B2 * | 4/2008 | Yamada | F28D 15/0275 353/121 |
| 8,042,955 | B2 * | 10/2011 | Matsumoto | H01S 5/4025 353/94 |
| 9,228,763 | B2 * | 1/2016 | Kim | F25B 21/02 |
| 10,043,730 | B2 * | 8/2018 | Refai-Ahmed | H01L 25/0655 |
| 10,062,664 | B2 | 8/2018 | Hsieh | |
| 10,504,816 | B2 * | 12/2019 | Beauchemin | H01L 23/38 |
| 11,145,566 | B2 * | 10/2021 | Refai-Ahmed | H01L 23/3677 |
| 11,246,211 | B1 * | 2/2022 | Refai-Ahmed | H01L 23/4006 |
| 11,373,929 | B1 * | 6/2022 | Refai-Ahmed | H01L 23/473 |
| 11,488,936 | B2 * | 11/2022 | Refai-Ahmed | H01L 23/3677 |
| 12,125,766 | B2 * | 10/2024 | Kim | H01L 23/38 |
| 12,203,706 | B2 * | 1/2025 | Salamon | F28D 15/0208 |
| 12,414,226 | B2 * | 9/2025 | Artman | H05K 1/18 |
| 2010/0050658 | A1 * | 3/2010 | Ali | H01L 23/38 62/3.2 |
| 2012/0139076 | A1 * | 6/2012 | Shankar | H01L 23/38 257/E23.101 |
| 2014/0356985 | A1 | 12/2014 | Ricci et al. | |
| 2019/0122704 | A1 | 4/2019 | Huang | |
| 2021/0134698 | A1 * | 5/2021 | Arrington | H01L 23/42 |
| 2021/0193549 | A1 * | 6/2021 | Eid | H01L 23/3735 |
| 2022/0149022 | A1 * | 5/2022 | Goto | H05K 1/185 |
| 2024/0057246 | A1 * | 2/2024 | Gupta | H01L 23/3677 |
| 2024/0114646 | A1 * | 4/2024 | Jaggers | H05K 7/2029 |
| 2024/0114658 | A1 * | 4/2024 | Helberg | G06F 1/20 |
| 2024/0290686 | A1 * | 8/2024 | Refai-Ahmed | H01L 23/3672 |
| 2025/0038066 | A1 * | 1/2025 | Krishnan | H10W 40/251 |
| 2025/0201647 | A1 * | 6/2025 | Lin | H01L 23/42 |
| 2025/0210458 | A1 * | 6/2025 | Wang | H01L 23/427 |

FOREIGN PATENT DOCUMENTS

| | | | | |
|---|---|---|---|---|
| JP | 2007535803 | A | 12/2007 | |
| JP | 2011082272 | A | 4/2011 | |
| KR | 20140109959 | A | 9/2014 | |
| KR | 20150002865 | A * | 1/2015 | H10W 40/28 |
| WO | WO-2024138186 | A1 * | 6/2024 | H01L 23/053 |
| WO | WO-2024155585 | A1 * | 7/2024 | H10N 10/17 |

OTHER PUBLICATIONS

Heinemann, S., et al. “Advanced chip designs and novel cooling techniques for brightness scaling of industrial, high power diode laser bars.” High-Power Diode Laser Technology XVI. vol. 10514. SPIE, 2018.

Vasil’Ev, L. L., et al. “System for cooling of electronic components.” Journal of Engineering Physics and Thermophysics 90 (2017): 95-101.

Mason, P. D., et al. “Scalable design for a high energy cryogenic gas cooled diode pumped laser amplifier.” Applied Optics 54.13 (2015): 4227-4348.

Heinemann, Stefan, et al. “Packaging of high-power bars for optical pumping and direct applications.” High-Power Diode Laser Technology and Applications XIII. vol. 9348. SPIE, 2015.

Kozlowska, Anna, et al. “Experimental study and numerical modeling of micro-channel cooler with micro-pipes for high-power diode laser arrays.” Applied Thermal Engineering 91 (2015): 279-287.

Ebadian, M. A., and C. X. Lin. “A review of high-heat-flux heat removal technologies.” Journal of heat transfer 133.11 (2011).

Cao, Haishan, and Guangwen Chen. “Optimization design of microchannel heat sink geometry for high power laser mirror.” Applied thermal engineering 30.13 (2010): 1644-1651.

Vetrovec, John. “Quasi-passive heat sink for high-power laser diodes.” High-Power Diode Laser Technology and Applications VII. vol. 7198. SPIE, 2009.

Agostini, Bruno, et al. “State-of-the-art of high heat flux cooling technologies.” Heat transfer engineering 28.4 (2007): 258-281.

Sung, Myung Ki, and Issam Mudawar. “Experimental and numerical investigation of single-phase heat transfer using a hybrid jet-impingement/micro-channel cooling scheme.” International journal of heat and mass transfer 49.3-4 (2006): 682-694.

Skidmore, J. A., et al. “Silicon monolithic microchannel-cooled laser diode array.” Applied physics letters 77.1 (2000): 10-12.

Karni, Y., Klumel, G., Levy, M., Berk, Y., Openhaim, Y., Gridish, Y., Elgali, A., Avisar, M., Blonder, M., Sagy, H. and Gertsenshtein, A., Feb. 2008, Active cooling solutions for high power laser diodes stacks. In High-Power Diode Laser Technology and Applications VIÂ (vol. 6876, pp. 28-36). SPIE.

Wallace, J., 2018. Keep your laser-diode system cool, whatever the power. Laser Focus World, 54(1), pp. 75-77.

* cited by examiner

SYSTEMS AND METHODS FOR COOLING HIGH POWER DEVICES

FEDERALLY SPONSORED RESEARCH OR DEVELOPMENT

This invention was made with Government support under Contract No. DE-AC52-07NA27344 awarded by the United States Department of Energy. The Government has certain rights in the invention.

FIELD

The present disclosure relates to systems and methods for cooling electronic devices, and more particularly to systems and methods for actively cooling semiconductor devices including stacked diode laser assemblies through the use of an embedded thermoelectric cooler.

BACKGROUND

The statements in this section merely provide background information related to the present disclosure and may not constitute prior art.

At the present time there is strong interest in improving the thermal management solution for a stacked diode laser assembly with lower stack pitch. By "stack pitch" it is meant the distance separating adjacent diode emitters making up the stacked diode laser assembly. Reducing the stack pitch improves the brightness of the beam generated by the stacked diode laser assembly. However, reducing the stack pitch, without suitable cooling, also contributes to increased heat. FIG. 1 shows one example of a previously developed stacked diode laser assembly 10. The assembly 10 is made up of a plurality of closely arranged diode lasers 12*a*-12*d* forming a column. In this example a plurality of 32 columns of diode lasers are used to form an X/Y grid of diode lasers which makes up the overall diode laser assembly 10. A cooling channel 12*e* may be formed in the substrate used to construct each one of the diode lasers, such that a plurality of parallel flow channels are formed through the assembly 10. An emitter facet is present at an end 12*f* of each diode laser 12. A section of thermally conductive material 14 may also be in contact with the diode lasers 12 to act as a heat sink. FIG. 1 also illustrates a vertical bar graph showing temperatures that may be reached at the emitters of the assembly 10. In this example the stacked diode laser assembly 10 forms a 900 W stacked diode laser assembly operating at 100 Hz. During operation, the average emitter temperature can become quite high (i.e., upwards of 70 degrees C.).

Most of the previously conducted research and work related to cooling active electronic devices, including diode lasers, has been devoted to single phase and multi-phase fluid based active cooling approaches (e.g., see, "*Active Cooling Solutions for High Power Laser Diodes Stacks*", Yoram Karni, Genady Klumel, Moshe Levy, Yuri Berk, Yaki Openhaim, Yaakov Gridish, Asher Elgali, Meir Avisar, Moshe Blonder, Hila Sagy, Alex Gertsenshtein, Semiconductor Devices; and also "*Photonics Products: Laser-Cooling Equipment: Keep Your Laser-diode System Cool, Whatever the Power Laser Diodes Work Best When Cool—Different Cooling Approaches Work Best for Different Laser Powers*", John Wallace, Jan. 18, 2018.

Most of the present day approaches for cooling stacked diode laser assemblies have relied on channel based cooling, as illustrated in FIG. 1. By "channel based" it is meant small channels 12*e* that are formed either in substrates or other components making up the stacked diode laser assembly, by which a cooling fluid is flowed through, or closely adjacent to, portions of the stacked diode laser assembly. However, because of the typically small cross-sectional configuration of the channels, channel based cooling solutions can often be susceptible to erosion, clogging and limited life. In addition, for applications where the form factor and weight of the device are paramount considerations, a channel based fluid management system typically takes considerable space to implement, and thus can significantly increase the overall footprint of the device.

Accordingly, there is a strong need in the art for cooling approaches and technologies which are well adapted for use with active electronic devices including, but not limited to, stacked diode laser assemblies. There is furthermore a strong need for cooling approaches and technologies which are well suited for use with active electronic devices, and particularly stacked diode assemblies, which do not involve any moving parts, and which provide innovative packaging configurations and materials that provide even smaller form factor solutions.

SUMMARY

This section provides a general summary of the disclosure and is not a comprehensive disclosure of its full scope or all of its features.

In one aspect the present disclosure relates to a thermoelectric cooling (TEC) embedded electronics. The system may comprise a substrate having a first surface and a second surface and constructed of a thermally and electrically conductive material. A die may be included which is configured to be supported from the first surface of the substrate and in thermal contact with the substrate, with the die forming a heat generating component. A TEC material element may also be included which has a first surface and a second surface, and which is configured to be positioned at least partially against the second surface of the substrate. A heat pipe may be included which has a first portion and a second portion, where the first portion is configured to be in thermal contact with the second surface of the TEC material, and the second portion is configured to sink heat generated by the die and transmitted through the substrate and the TEC material.

In another aspect the present disclosure relates to a thermoelectric cooling (TEC) embedded electronics system. The system may comprise a thermally and electrically conductive substrate having an outer surface and an opening forming an inner surface. A die is included which is configured to be supported from the outer surface of the substrate and in thermal contact with the substrate. The die forms a heat generating semiconductor component. An N-type TEC material element is included which forms a continuous loop disposed within the opening of the thermally conductive substrate, and which has an outer surface and an inner surface. The outer surface of the N-type TEC material element is positioned in contact with the inner surface of the substrate. A heat pipe is included which has a first portion and a second portion. The first portion is configured to be disposed within the opening of the substrate and in thermal contact with the second surface of the TEC material. The second portion is configured to project outwardly from the opening and to sink heat generated by the die and transmitted through the substrate and the N-type TEC material. A TEC cooled heat sink is included which is in contact with the second portion of the heat pipe, to sink heat from the heat pipe.

In still another aspect the present disclosure relates to a method for cooling an electronics system. The method may comprise providing a die forming a heat generating component and using an electrically conductive material layer to support the die. The method may also include using a substrate having a first surface and a second surface and constructed of a thermally conductive material to support the electrically conductive material layer on the first surface, with the substrate including an opening. The method may further include using a TEC material element having a first surface and a second surface, which is configured to at least partially line the second surface of the substrate, to form a ground layer. The method may further include providing a current to the electrically conductive material layer and transmitting the current from the electrically conductive material layer to the substrate. The method may further include using the substrate to facilitate sinking heat generated by the die through the substrate and through the TEC material element, and using a heat pipe positioned at least partially within the opening, and in thermal contact with the TEC material element, to sink heat from the TEC material element.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The present disclosure is related to a thermoelectric cooler ("TEC") system which makes use of an embedded TEC subassembly that can be used in connection with semiconductor devices, for example and without limitation, stacked diode laser assemblies, to actively, effectively cool one or more dies each forming electronic and/or electro-optical components. The TEC material of the TEC system acts as an active cooler. The packaging configuration of the TEC system, which makes use of one or more TEC subassemblies, allows cooling of the entire die(s) without use of fluid, and importantly without the need for forming cooling fluid flow channels between adjacent dies. This elimination of cooling channels enables the pitch of a stacked diode laser to be reduced, resulting in improved brightness of the beam produced by a stacked diode laser assembly. The manner of constructing the TEC assembly is fully compatible with present day thin film TEC materials. A manufacturing process used to construct/integrate the TEC subassemblies with the dies(s) to form a larger, fully integrated TEC system, as explained herein, is fully compatible with present day semiconductor manufacturing processes. Solder hierarchy is also the same as the conventional solder hierarchy when using AuSn or AuIn. The substrate in contact with a GaAs of the die is preferably CTE (coefficient of thermal expansion) matched, as with present day active cooling systems and designs.

Figure 1:
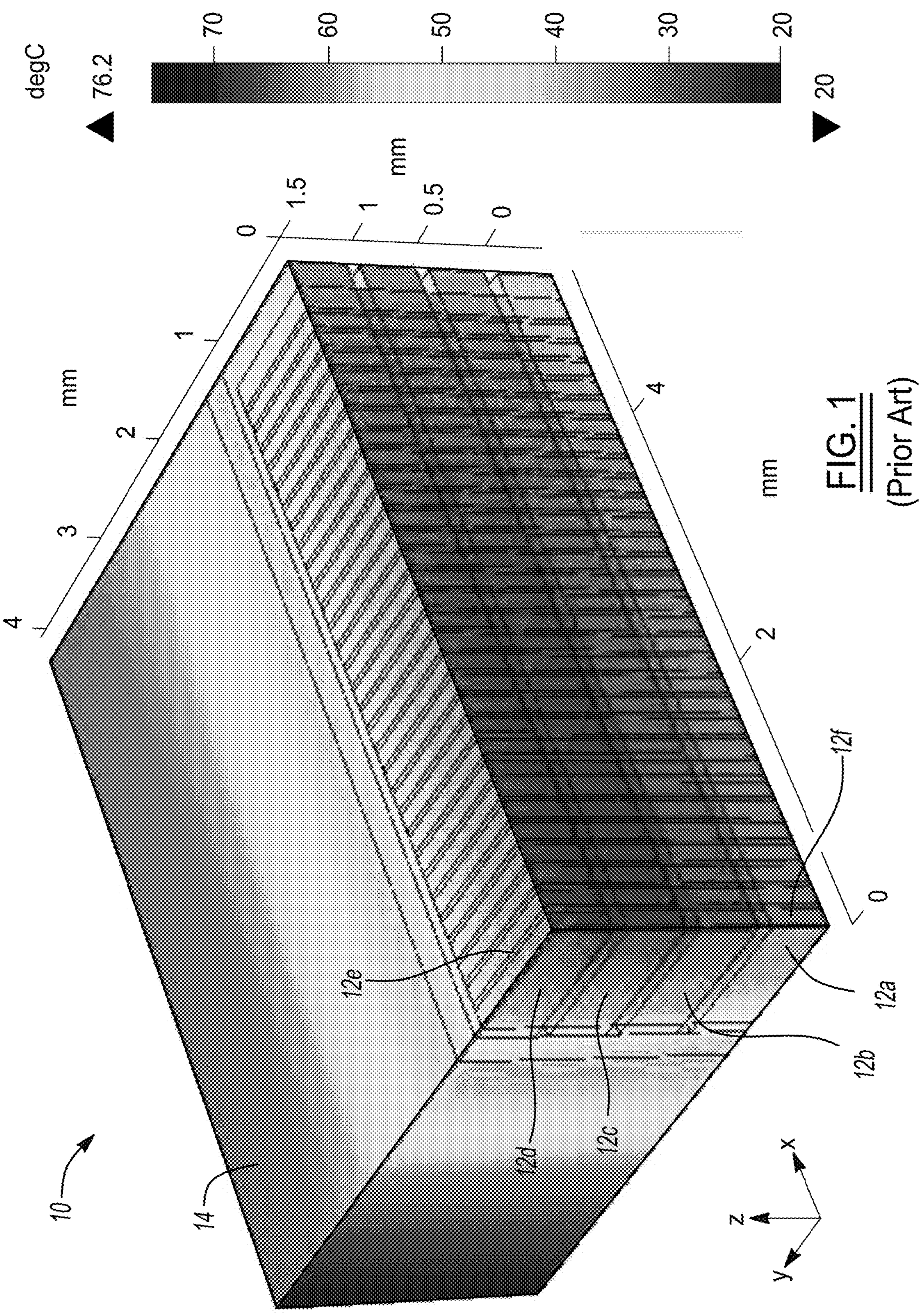
FIG. 1 (Prior Art)
FIG. 1 is a view of a prior art stacked diode laser assembly together with a colored vertical temperature graph illustrating the high temperatures that various portions of the stacked diode laser assembly may reach during operation.
Figure 2:
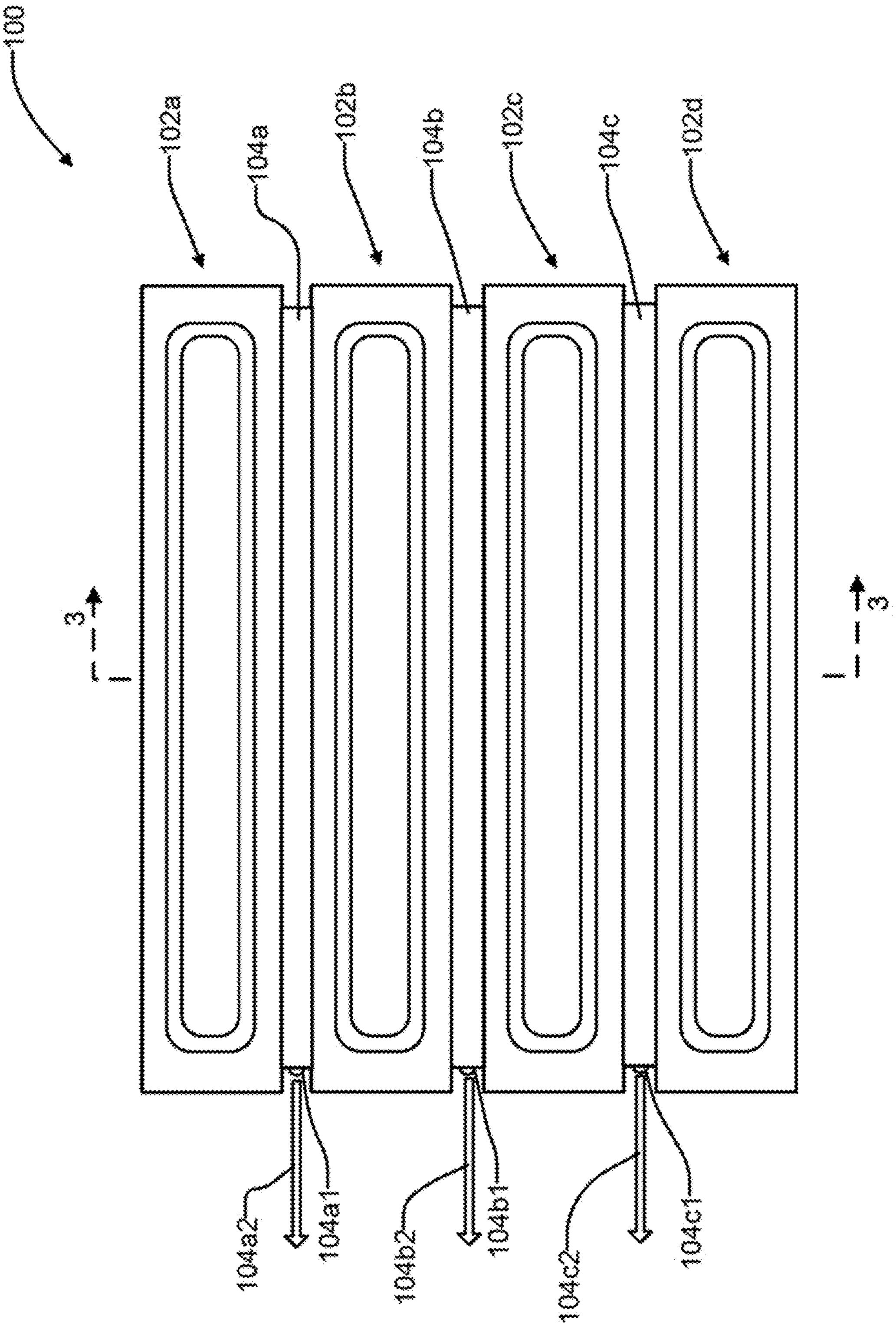
FIG. 2 is a side view of one embodiment of a stacked diode laser assembly in accordance with the present disclosure which incorporates a plurality of embedded thermoelectric cooler ("TEC") subassemblies.
Figure 3:
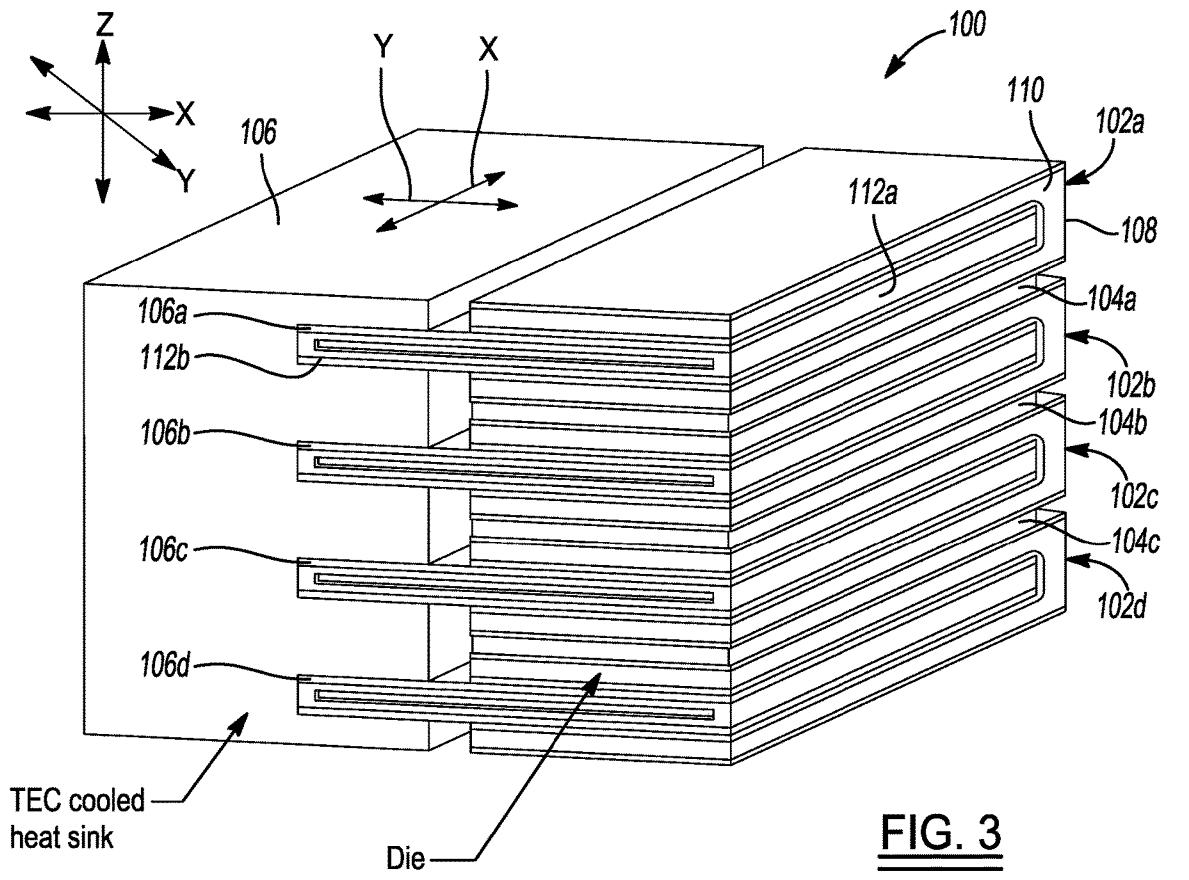
FIG. 3 is a cross-sectional end view of the diode laser assembly according to section line 3-3 in FIG. 2.

Referring now to FIGS. 2 and 3, one embodiment of a TEC system 100 is shown in accordance with the present disclosure. In this embodiment the TEC system 100 forms a stacked diode laser system having a plurality of TEC subsystems 102*a*-102*d* between which are sandwiched dies 104*a*-104*c*. As such, the TEC subsystems 102*a*-102*d* may be understood as being "embedded" between the dies 104*a*-104*c*.

Each of the TEC subassemblies 102*a*-102*d* are in contact a TEC cooled heatsink 106 (FIG. 3). In one embodiment the TEC cooled heatsink 106 may be formed from pyrolytic graphite, which provides the advantage that its thermal conductivity is anisotropic. More specifically, the pyrolytic graphite is conductive in the X/Y plane formed by the X and Y axes arrows in FIG. 3. As such, virtually no heat is conducted along the Z axis, which helps to significantly limit the transfer of heat from one die 104*a*-104*c* to its elevationally adjacent die.

In this example the dies 104*a*-104*c* each form heat generating components in the form of diode lasers. The dies 104*a*-104*c* each have an associated facet 104*a*1, 104*b*1 and 104*c*1, which is shown formed at an end of the dies 104*a*-104*c*, respectively. The dies 104*a*-104*c* may be formed from any suitable material used to construct semiconductor diode lasers, but a typically used material is GaAs. The facets 104*a*1-104*c*1 each project a beam of light 104*a*2-

104*c*2, respectively, out from its associated diode laser 104*a*-104*c*. It will be appreciated, however, that a stacked diode laser is only one example of a semiconductor-based system that the TEC system 100 can be used to help form. The TEC system 100 can be integrated into the construction of virtually any type of semiconductor-based component or system (e.g., memory, processor, switching, communications, etc.), and possibly other types of electronic, electro-optical or other heat generating devices, where active cooling is desired.

Referring further to FIGS. 2 and 3, each of the TEC subsystems 102*a*-102*d* is constructed identically in this example, and have the same dimensions and overall configuration, although they need not be identically constructed. Furthermore, they all need not have the same exact dimensions. Merely for convenience, the system 100 is shown incorporating four identically constructed and dimensioned TEC subsystems. Accordingly, the following description of TEC subsystem 102*a* will be understood as being applicable to the other TEC subsystems 102*b*-102*d*.

Figure 4:
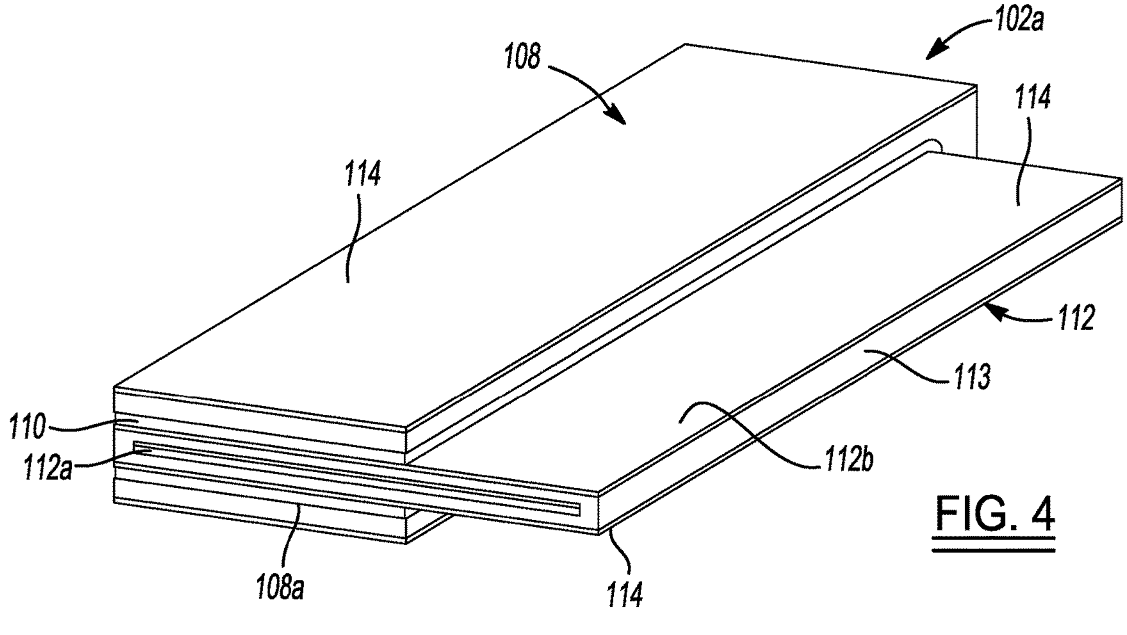
FIG. 4 is an enlarged, cross-sectional perspective end view of just one of the TEC subassemblies shown in FIG. 3.
Figure 5:
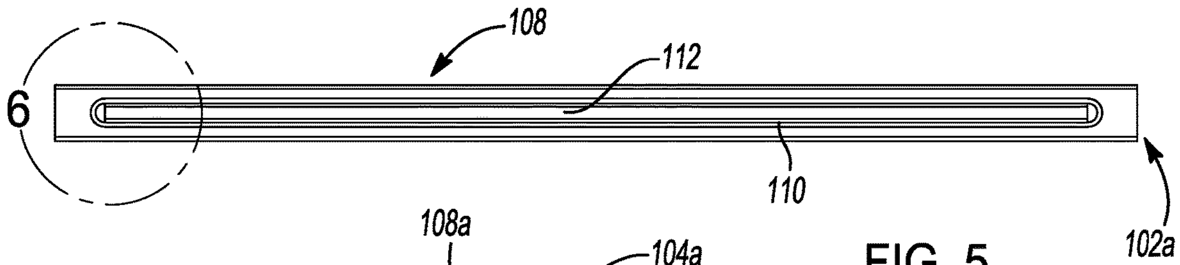
FIG. 5 is a side view of one of the TEC subassemblies shown in FIG. 2.
Figure 6:
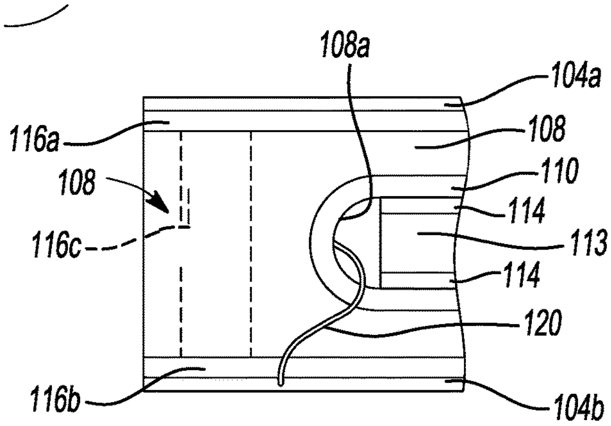
FIG. 6 is an enlarged side view of just one end of the TEC subassembly shown in FIG. 5 in accordance with circled section 6 in FIG. 5.
Figure 7:
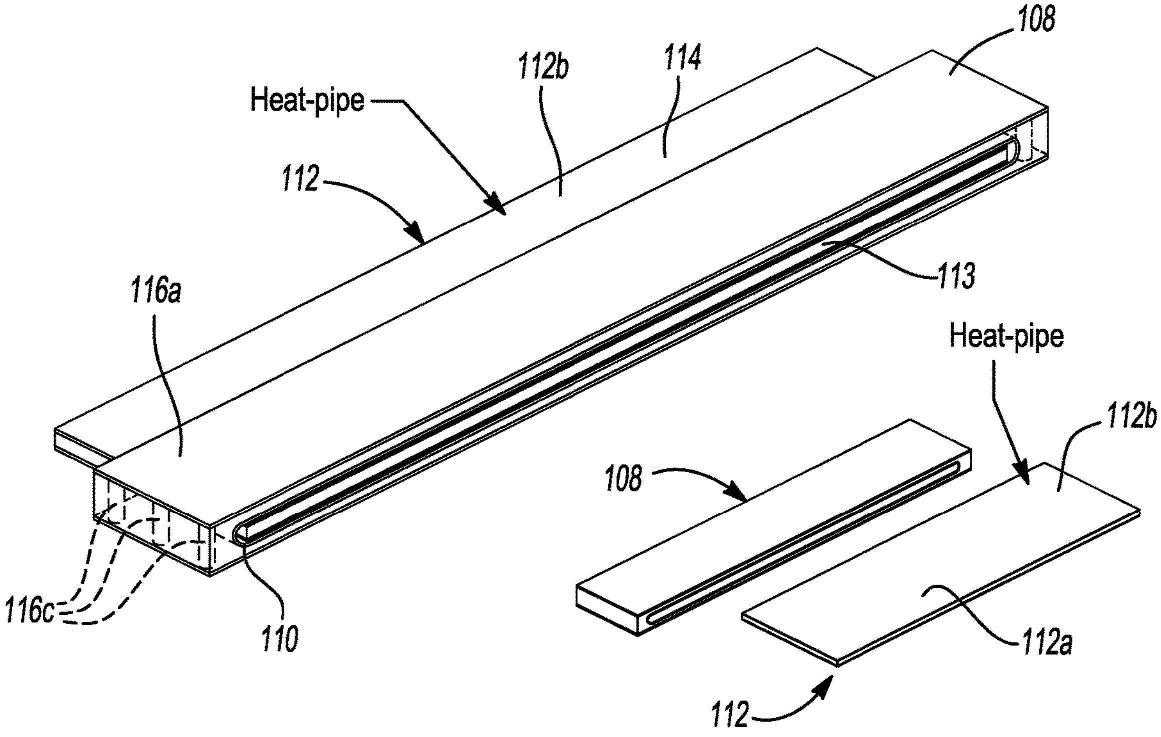
FIG. 7 is an exploded perspective view of the TEC subassembly shown in FIG. 6 but also including the Through Silicon Vias ("TSVs") which are used to supply a positive voltage to the subassembly.

Referring to FIGS. 4-7, TEC subsystem 102*a* is shown in greater detail along with various components that enable each TEC subsystem 102*a*-102*d* to form a N/P material assembly. Referring initially to FIGS. 4 and 6, the TEC subsystem 102*a* can be seen to include a substrate 108 having an opening, in this example an elongated opening 108*a*. Within the elongated opening 108*a* is positioned a TEC material element which forms a ground layer 110 comprised of an N-type TEC material. The ground layer 110 in this example forms a continuous loop within the substrate 108. Within the ground layer 110 is positioned a heat pipe assembly 112 having portions 112*a* and 112*b* (FIGS. 4 and 7). In this example the heat pipe assembly 112 forms a planar component in which the first portion 112*a* is disposed within the substrate 108. The heat pipe assembly 112 has a hollow, planar central section 113 of material, for example and without limitation, Si, SiC or pyrolytic graphite. In this example the opposing surfaces of the planar central section 113 of the heat pipe assembly 112 may each have a material layer 114 formed thereon, which may be, for example and without limitation, Cu, Au or Ag. The material layers 114 act as thermal terminals to help channel heat out from the ground layer 110 into the first portion 112*a* of the heat pipe assembly 112. The material layers 114 need not fully cover the entire surface area of each opposing side of the planar central section 113 of the heat pipe assembly 112, but such a construction is expected to simplify manufacture of the heat pipe assembly. Preferably, at least a portion of both opposing surfaces of the central planar section 113 of the heat pipe assembly 112 are covered with the material layer 114.

The ground layer 110 may be formed using any suitable N-type TEC material, for example and without limitation, La doped Strontium Titanate ($SrTiO_3$), InSb, etc. The ground layer 110 forms the "N" portion of the N/P TEC subassembly 102, and thus helps to "sink" or draw heat from the substrate 108 into the heat pipe assembly 112 during operation of the assembly 100.

With brief reference to FIG. 3, the TEC cooled heat sink 106 has at least one channel 106*a*, and more preferably a plurality of channels 106*a*-106*d*. Each of the channels 106*a*-106*d* is in physical contact with the heat pipe assembly 112 of an associated one of the TEC subsystems 102*a*-102*d*. In the example of FIG. 3, the second portion 112*b* of the heat pipe assembly 112 is disposed in channel 106*a*. The TEC cooled heat sink 106 operates to sink or draw heat from its associated heat pipe assembly 112. In this manner, the heat built up on the die 104*a* is drawn out initially into the substrate 108, then into the ground layer 110, then into the first portion 112*a* of the heat pipe assembly 112, then conducted to the second portion 112*b* of the heat pipe assembly, and then finally conducted into the TEC cooled heat sink 106 where it is then dissipated into the ambient atmosphere.

The substrate 108 preferably is formed from a material which is tuned to match the CTE of the die 104*a*-104*c* CTE. The substrate 108 may be formed from a custom material, for example and without limitation, from Si/Cu. The Cu material operates to add an additional path for current flow while the Si material contributes toward local thermoelectrical cooling. Alternatively, the substrate 108 may be constructed from a more commonly used material such as, without limitation, CuW, CuD or AlN. These materials are all compatible with current material configurations currently in use with TEC cooled devices.

With specific reference to FIGS. 6 and 7, the heat pipe assembly 112 can be seen to be positioned within the substrate 108, which is in turn positioned within, and in physical contact with, two planar electrically conductive material layers 116*a* and 116*b*, and where the two planar electrically conductive material layers 116*a* and 116*b* are connected by at least one TSV (a "through silicon via") 116*c*. and more preferably a plurality of TSVs 116*c* (FIG. 7). Accordingly, in this configuration, each of the electrically conductive material layers 116*a* and 116*b* is sandwiched between a respective one of the dies 104*a* or 104*b* and an outer surface of the substrate 108. The TSVs 116*c* are also electrically conductive and configured to distribute an electric current to each of the dies 104*a*/104*b*. The magnitude of the electric current used may vary significantly depending on the specific needs of the dies 104*a*-104*c*, but in one example the current may be on the order of about $1\times10^4$ amps/$m^2$.

The dies 104*a*/104*b* are electrically coupled, for example by eutectic solder (e.g., AuSn, AuIn) to their respective electrically conductive material layers 116*a*/116*b*. As noted in FIG. 6, the ground layer 110 is electrically coupled to an electrical conductor 120 which leads out from the interior of the substrate 108, and which may be coupled to a system ground for the overall TEC system 100. Similarly, current from an external current source may be fed via a separate conductor (not shown) to the TSVs 116*c*, to thus feed current to the conductive layers 116*a* and 116*b* and to the dies 104*a*-104*c* (e.g., diodes). In this manner a serial connection can be made from the dies 104*a* and 104*b* to other dies that are disposed adjacent the opposing surfaces of the TEC subsystem 102*a*.

The construction of the TEC subsystem 102*a* is not limited by the magnitude of joules heating created by the active electronic components it is used with. Put differently, the TEC subassembly 102 can be engineered to handle the expect level of Joules heating created by the active electronic components which the TEC subsystems 102*a*-102*d* are used with, and thus which help form the complete TEC system 100.

Figure 8:
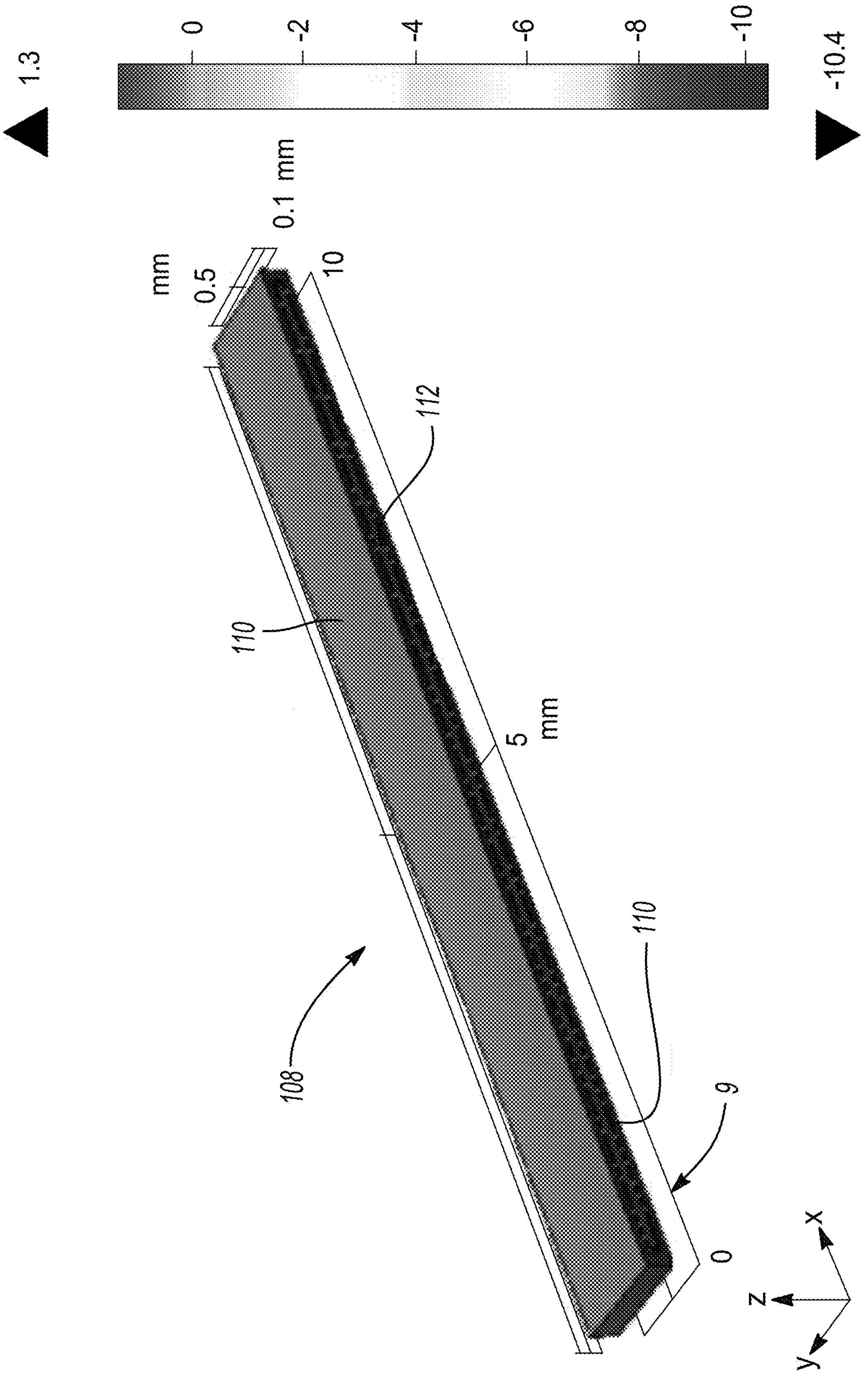
FIG. 8 is a perspective view of the TEC subassembly of FIG. 5 along with a vertical temperature bar graph illustrating the significant temperature differential between the heat pipe of the TEC subassembly and the temperature of the substrate, illustrating how effectively the TEC subassembly extracts heat from the die.
Figure 9:
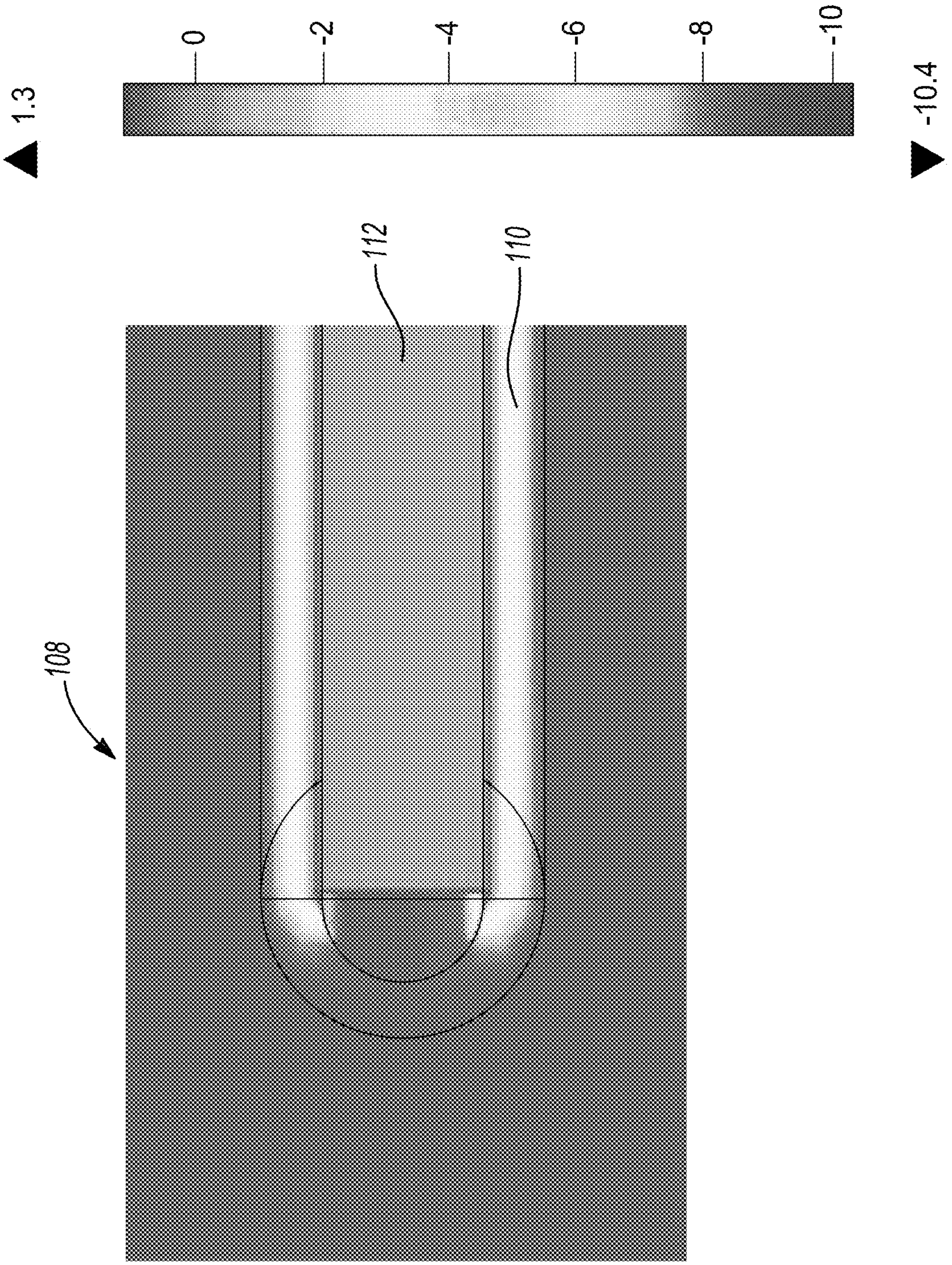
FIG. 9 is an enlarged side view of just the left end of the TEC subassembly of FIG. 8 taken along arrow 9 in FIG. 8, along with a vertical temperature bar graph, further illustrating the significant temperature differential between the heat pipe and the substrate.

Referring now to FIGS. 7 and 9, the significant temperature difference can be seen for the heat pipe assembly 112 relative to the substrate 108. FIG. 9 shows a highly enlarged side view of the left end of the TEC subsystem 102*a* of FIG. 8, further illustrating the different levels of heat present between the substrate 108, the ground layer 110 and the heat pipe assembly 112. The heat pipe assembly 112, which acts as a local heatsink to remove heat (in Joules) from the substrate 108, has extracted a significant amount of heat which will be transferred to the TEC cooled heat sink 106.

Figure 10:
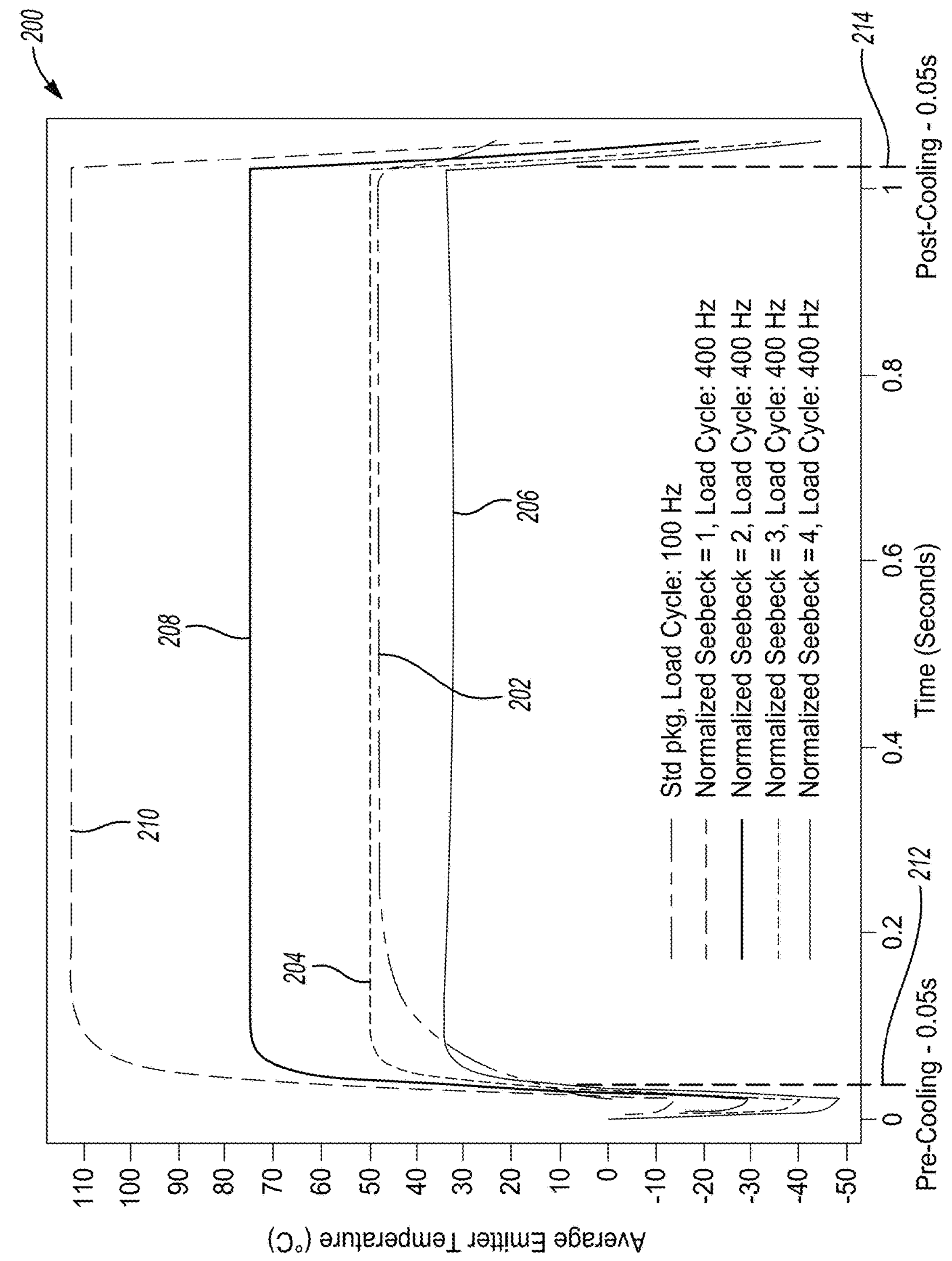
FIG. 10 is a graph showing curves representing average diode laser emitter temperatures relative to time for different normalized Seebeck values, using a 400 Hz load cycle, compared to a standard stacked diode laser package using a 100 Hz load cycle.

Referring to FIG. 10, a graph 200 is shown with a plurality of curves 202-210 to illustrate average emitter temperatures for the TEC system 100 of the present disclosure, where the TEC subsystems 102*a*-102*d* are constructed to provide different Seebeck values, and with the dies 104*a*-104*d* (e.g., diode lasers) operated with different load cycles, as compared to a standard diode laser package (e.g., stacked diode laser with conductive substrate and/or channels used for cooling). Dashed line 212 denotes a 0.05 second pre-cooling time interval (i.e., no heat applied), and dashed line 214 denotes a 0.05 post-cooling time period. It is noteworthy that curve 204 shows that for the TEC system 100 described herein, when operated at a load cycle of 400 Hz, or in other words four times the duty cycle of the 100 Hz load cycle, the emitter temperature experienced is virtually the same (actually only very small percentage higher) than the emitter temperature produced from a standard stacked diode laser package running at the 100 Hz load duty cycle.

The various embodiments of the present disclosure thus provide a means to construct even more dense, more compact, TEC stacked semiconductor assemblies, and particularly stacked diode laser assemblies. Moreover, the teachings of the present disclosure are not limited to just the construction of stacked diode laser assemblies, but are readily adaptable to create other TEC embedded electronic/optical systems. The teachings of the present disclosure also do not require significant modifications to present day, actively cooled semiconductor manufacturing processes, and can be used to cost effectively create embedded TEC electronic devices and systems for a wide variety of applications.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A thermoelectric cooling (TEC) embedded electronics system comprising:

a substrate having a first surface and a second surface and constructed of a thermally and electrically conductive material, the substrate further forming an opening where the second surface defines a continuous wall;

a die configured to be supported from the first surface of the substrate and in thermal contact with the substrate, the die forming a heat generating component;

a TEC material element having a first surface and a second surface, and configured to be positioned at least partially against the second surface of the substrate, and at least partially housed within the continuous wall of the substrate; and a heat pipe having a first portion and a second portion, the first portion configured to be in thermal contact with the second surface of the TEC material, and the second portion configured to sink heat generated by the die and transmitted through the substrate and the TEC material.

2. The system of claim 1, further comprising a first additional electrically conductive material layer disposed on the first surface of the substrate and configured to receive a current; and where the first additional electrically conductive material layer is sandwiched between the die and the first surface of the substrate.

3. The system of claim 2, further comprising an electrically conductive via in electrical contact with the first additional electrically conductive material layer and configured to supply electrical current to the first additional electrically conductive material layer.

4. The system of claim 3, further comprising a second electrically conductive material layer disposed on the substrate and configured to receive the electrical current from the electrically conductive via.

5. The system of claim 4, wherein the first and second electrically conductive material layers are disposed on opposing sides of the substrate.

6. The system of claim 1, wherein the continuous wall portion formed by the second surface of the substrate forms a continuous, elongated opening.

7. The system of claim 6, wherein TEC material element comprises an N-type TEC material, and is disposed in thermal contact with the second surface of the substrate.

8. The system of claim 7, wherein the TEC material element forms a continuous loop of N-type TEC material lining the continuous, elongated opening of the substrate.

9. The system of claim 8, wherein the heat pipe forms a planar component having a planar central section of material, and a pair of terminal material layers configured to assist in channeling heat from the TEC material element into the planar central section of material.

10. The system of claim 9, wherein the planar central section of material comprises at least one of Si, SiC or pyrolytic graphite.

11. The system of claim 1, further comprising a TEC cooled heat sink component configured to be in thermal contact with the second portion of the heat pipe.

12. The system of claim 11, wherein the TEC cooled heat sink comprises a monolithic block of thermally conductive material having a channel formed therein, and wherein the channel is configured to receive the second portion of the heat pipe.

13. The system of claim 1, wherein the die comprises a diode laser, and wherein the system comprises a TEC stacked diode laser assembly.

14. A thermoelectric cooling (TEC) embedded electronics system comprising:

a thermally and electrically conductive substrate having an outer surface and an opening forming an inner surface of the substrate;

a die configured to be supported from the outer surface of the substrate and in thermal contact with the substrate, the die forming a heat generating semiconductor component;

an N-type TEC material element forming a continuous loop disposed within the opening of the thermally conductive substrate, and having an outer surface and an inner surface, and the outer surface of the N-type TEC material element being positioned in contact with the inner surface of the substrate;

a heat pipe having a first portion and a second portion, the first portion configured to be disposed within the opening of the substrate and in thermal contact with the second surface of the TEC material, and the second portion configured to project outwardly from the opening and to sink heat generated by the die and transmitted through the substrate and the N-type TEC material; and a TEC cooled heat sink in contact with the second portion of the heat pipe, to sink heat from the heat pipe.

15. The system of claim 14, further comprising:

first and second planar, electrically conductive material layers secured to opposing portions of the outer surface of the substrate; and at least one through silicon via (TSV) electrically connecting the first and second planar, electrically conductive material layers, the at least one TSV configured to receive an electric current and to transmit the electric current to the die.

16. The system of claim 14, wherein the substrate comprises a substrate material of at least one of Si/CU, CuW, CuD or AlN; and wherein the substrate material is selected to have a coefficient of thermal expansion (CTE) which is tuned to match a CTE of the die.

17. The system of claim 14, wherein the TEC cooled heat sink includes a channel, and wherein the second portion of the heat pipe is located in the channel.

18. A thermoelectric cooling (TEC) embedded electronics system comprising:

a substrate having a first surface and a second surface and constructed of a thermally and electrically conductive material;

a die configured to be supported from the first surface of the substrate and in thermal contact with the substrate, the die forming a heat generating component;

a TEC material element having a first surface and a second surface, and configured to be positioned at least partially against the second surface of the substrate;

a heat pipe having a first portion and a second portion, the first portion configured to be in thermal contact with the second surface of the TEC material, and the second portion configured to sink heat generated by the die and transmitted through the substrate and the TEC material; and the TEC material element further forming a continuous loop of N-type TEC material lining the opening of the substrate.

* * * * *